United States Patent [19]
Hunt et al.

[11] Patent Number: 5,793,682
[45] Date of Patent: Aug. 11, 1998

[54] CIRCUIT AND METHOD FOR DISABLING A BITLINE LOAD

[75] Inventors: Jeffery Scott Hunt, Ackerman; Satish C. Saripella, Starkville, both of Miss.

[73] Assignee: Cypress Semiconductor Corp., San Jose, Calif.

[21] Appl. No.: 742,449

[22] Filed: Nov. 1, 1996

[51] Int. Cl.⁶ ............................................. G11C 7/00
[52] U.S. Cl. ........................ 365/195; 365/190; 365/191
[58] Field of Search ............................. 365/195, 191, 365/190, 189.01

[56] References Cited

U.S. PATENT DOCUMENTS

| | | | |
|---|---|---|---|
| 5,349,560 | 9/1994 | Suh et al. | 365/190 X |
| 5,450,353 | 9/1995 | Koike | 365/195 X |
| 5,577,225 | 11/1996 | McClure | 365/195 X |
| 5,579,265 | 11/1996 | Devin | 365/195 X |
| 5,666,310 | 9/1997 | Yu et al. | 365/185.21 |

Primary Examiner—Do Hyun Yoo
Attorney, Agent, or Firm—Maiorana & Acosta, P.C.

[57] ABSTRACT

The present invention concerns a circuit and method for disabling the load transistors from the bitlines of a memory array without requiring a fuse. After a particular column is disabled in a redundant memory array system, a short between the particular bitline and ground is detected by a control circuit that shuts off the appropriate bitline load. The disconnecting of the particular bitline load does not affect any of the normal read or write operations of the circuit. The present invention detects whether the short exists and provides the disabling feature while maintaining the ability to distinguish between a normal write condition and a condition that resembles a bitline short. After a write occurs, the bitline load will remain active. The ability of the present invention to distinguish between a normal write and a bitline short allows for transparent operation.

17 Claims, 3 Drawing Sheets

CIRCUIT AND METHOD FOR DISABLING A BITLINE LOAD

FIELD OF THE INVENTION

The present invention relates to memory redundancy generally and, more particularly, to a circuit and method to detect a bitline to power supply short and to disable the corresponding bitline load in a memory redundancy situation.

BACKGROUND OF THE INVENTION

One implementation of eliminating current through a bitline load for a bitline to VSS short requires a fuse. The fuse disconnects the bitline loads from the input supply voltage VCC or shuts off the bitline loads. During a write condition, one of the bitlines is pulled low so data can be written into the memory cell. By pulling one bitline low and the other bitline high, a particular value is written into the memory cell. By pulling the bitlines in the opposite directions, the opposite value is written into the memory cell.

FIG. 1 illustrates a circuit 10 for deselecting a particular bitline load. The circuit 10 generally comprises a bitline 12a, a bitline 12b, a memory cell 14, a bitline load 16 and a fuse control circuit 18. The bitlines 12a–12b pass through the memory cell 14 to the bitline load 16. The fuse control circuit 18 provides a signal path 20 that disconnects the bitline load 16 from the bitlines 12a and 12b when a particular column (which includes the memory cell 14) is disconnected.

While the approach of using a fuse control circuit may produce the desired effect, fuses have the disadvantages of being somewhat unreliable. It is generally undesirable to blow an additional fuse to disable the bitline load 16 after correcting a row or column using redundancy. Eliminating the additional fuse improves the reliability of the row redundancy or column redundancy repair since fewer fuses are required to be blown to repair a bad row or bad column. The device must be tested after being repaired to ensure that the device functions correctly. The probability for device failure after repair is reduced if fewer fuses are blown.

Referring to FIG. 2, a more detailed diagram of the circuit 10 is shown. The bitline line load block 16 is shown as comprising a load transistor 22 and a load transistor 24. The drain of the load transistor 22 is connected to the bitline 12a while the drain of the load transistor 24 is connected to the bitline 12b. The gates of the load transistors 22 and 24 are generally connected to ground. The sources of the load transistors 22 and 24 are generally coupled together and are connected to the fuse control block 18. If a short occurs between either a bitline 12a or 12b and the power supply VCC, the current will flow from the input power supply VCC through the bitline load block 16. The amount of current that flows through the bitline load block 16 depends on the size of the load transistors 22 and 24. To eliminate the current through the transistors 22 and 24, the fuse 18 must be blown which disconnects the input power supply VCC from the load transistors 22 and 24 to eliminate the current path.

An additional implementation may require that the sources of the load transistors 22 and 24 could be connected to the input power supply VCC while the gates of the transistors 22 and 24 could be connected to a fuse logic to force the gates high if a bitline short occurs. However, a fuse would still be required to disable the bitline to VSS short condition.

SUMMARY OF THE INVENTION

The present invention concerns a circuit and method for disabling the load transistors from the bitlines of a memory array without requiring a fuse. After a particular column is disabled in a redundant memory array system, a short between the particular bitline and ground is detected by a control circuit that shuts off the appropriate bitline load. The disconnecting of the particular bitline load does not affect any of the normal read or write operations of the circuit. The present invention detects whether the short exists and provides the disabling feature while maintaining the ability to distinguish between a normal write condition and a condition that resembles a bitline short. After a write occurs, the bitline load will remain active. The ability of the present invention to distinguish between a normal write and a bitline short allows for transparent operation.

The objects, features and advantages of the present invention include providing a circuit for detecting a bitline to VSS power supply short that disables the bitline loads to eliminate load current which may enable a low current specification to be met. The circuit eliminates the need for a fuse disconnect, disables the bitline loads during a write condition, allows a solid "0" state to be written and distinguishes between a normal write and a bitline short.

BRIEF DESCRIPTION OF THE DRAWINGS

These and other objects, features and advantages of the present invention will be apparent from the following detailed description and the appended claims and drawings in which:

DETAILED DESCRIPTION OF THE PREFERRED EMBODIMENTS

Figure 1:
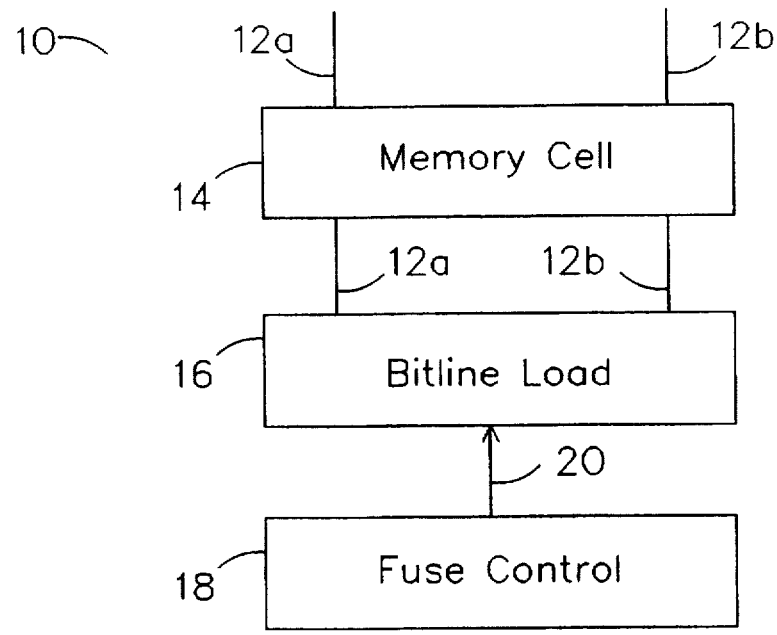
FIG. 1 is a block diagram of a previous approach.
Figure 2:
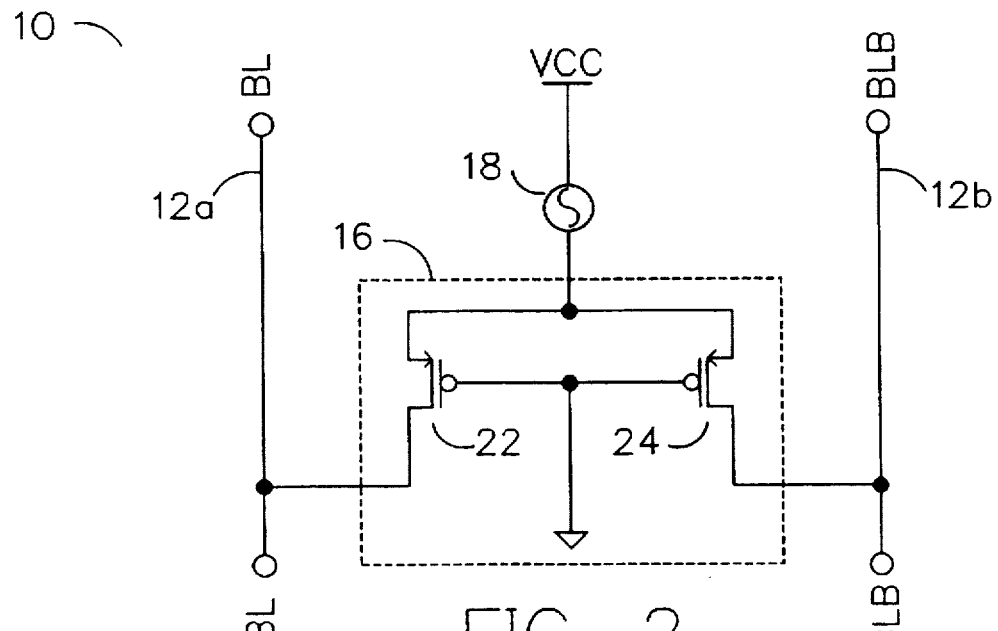
FIG. 2 is a circuit diagram of the previous approach circuit of FIG. 1.
Figure 3:
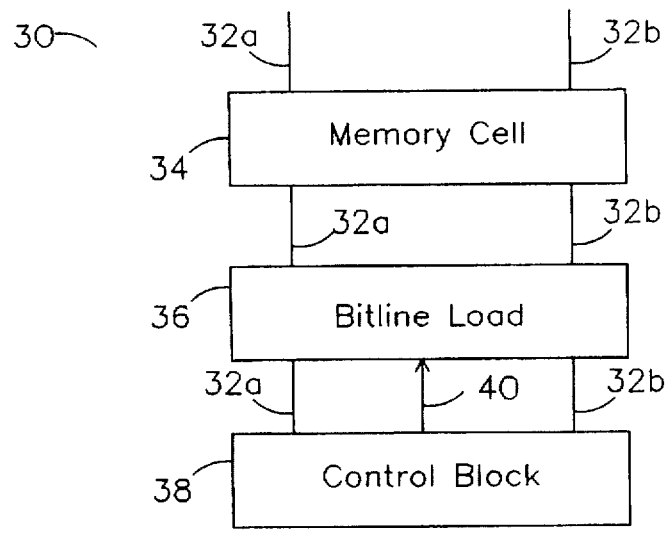
FIG. 3 is a block diagram of a preferred embodiment of the present invention.

Referring to FIG. 3, a block diagram of a circuit 30 is shown in accordance with a preferred embodiment of the present invention. The circuit 30 generally comprises a number of bitlines 32a and 32b, a memory cell 34, a bitline load block 36 and a control block 38. The bitlines 32a and 32b pass through the memory cell 34 and the bitline load block 36 to the control block 38. The control block 38 presents a signal path 40 to the bitline load block 36. The control block 38 provides information through the signal path 40 that disconnects the bitline load block 36 from the bitlines 32a and 32b during a cell disabling condition such as during a short between one of the bitlines 32a or 32b and ground.

Figure 4:
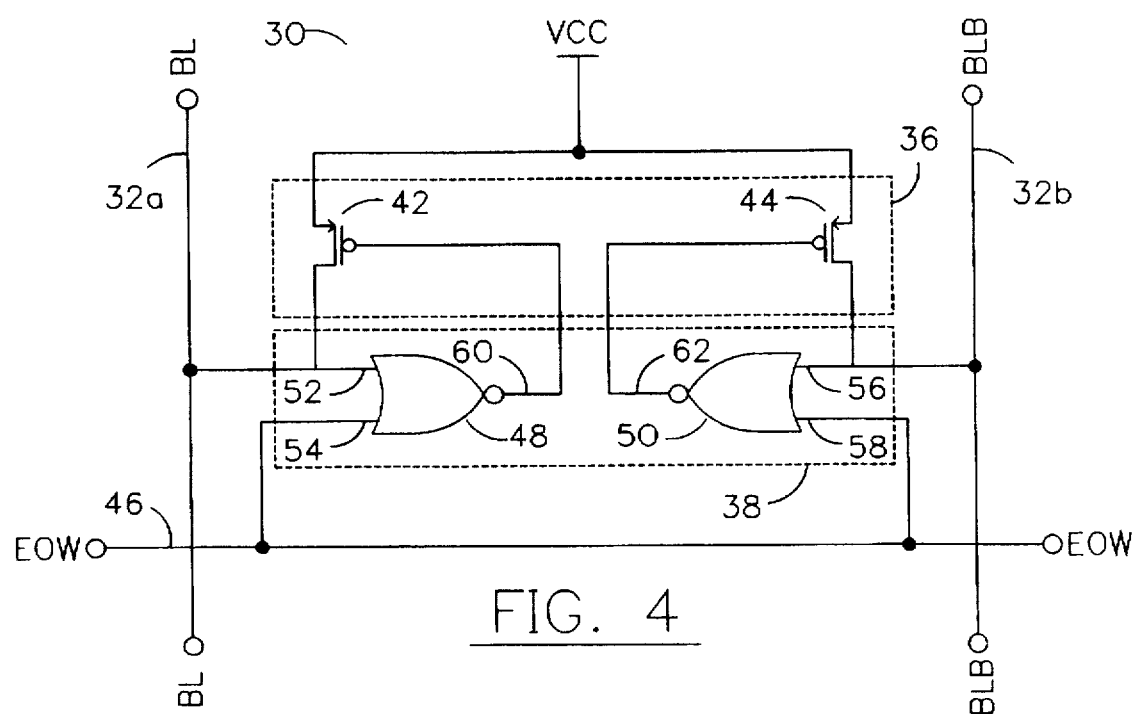
FIG. 4 is a circuit diagram of a preferred embodiment of the present invention.

Referring to FIG. 4, a more detailed diagram of the circuit 30 is shown. The bitline load block 36 generally comprises a load transistor 42 and a load transistor 44. The load transistor 42 and the load transistor 44 are generally shown as P-channel transistors. However, other types of load transistors may be controlled by the control block 38. The sources of the load transistors 42 and 44 may be coupled to an input supply voltage, such as a voltage VCC. However, other supply voltages may be used according to the design criteria of a particular application. The drains of the load transistors 42 and 44 may be connected to the control block 38 as well as to the bitlines 32a and 32b respectively. An end of write (EOW) line 46 is a globally generated signal which generally presents a signal to the control block 38. The EOW line 46 generally represents a write control signal indicating the end of a write to the memory cell 34. The control block 38 generally comprises a NOR gate 48 and a NOR gate 50. The NOR gate 48 is shown having an input 52 that may receive a signal from the drain of the transistor 42 as well as from the bitline 32a and an input 54 that may receive a signal from the EOW line 46. The NOR gate 50 has an input 56 that may receive a signal from the drain of the transistor 44 as well as from the bitline 32b and an input 58 that may receive a signal from the EOW line 46. An output 60 of the NOR gate 48 may present a signal to the gate of the load transistor 42. Similarly, an output 62 from the NOR gate 50 may present a signal to the gate of the load transistor 44. When a short condition is sensed by the NOR gate 48, the signal at the output 60 turns off the load transistor 42. Similarly, when a short condition is detected by the NOR gate 50, a signal present at the output 62 turns off the load transistor 44.

The load transistors 42 and 44 are generally shown as P-channel load devices. If an N-channel load device were substituted, the NOR gates 48 and 50 would be substituted with OR gates.

During a read operation, the end of write line 46 is generally a "0" which enables the NOR gates 48 and 50. If one of the bitlines 32a or 32b is not shorted to the power supply VCC, the load transistors 42 and 44 remain "on" since the bitline swing from a read operation does not drop below the trip point of the NOR gates 48 and 50.

During a write operation, the end of write line 46 is initially a "0" which enables the NOR gates 48 and 50. In order to properly write to the memory cell, one of the bitlines 32a or 32b will be pulled to "0" which is going to look like a VCC short to the circuit 30. As the particular bitline 32a or 32b is pulled low, one of the NOR gates 48 or 50 will detect this level and shut off the corresponding load transistor 42 or 44. By shutting off one of the load transistors 42 or 44, one of the bitlines 32a or 32b are allowed to be pulled to a solid "0" state. Turning off the bitline load transistors 42 and 44 is important if the path from the write drivers (not shown) to the bitlines 32a or 32b is resistive such that a solid "0" is not placed on the bitline 32a or 32b. This results in a reduction of the write margin. If the resistance from the write driver is high enough, the memory cell 34 may not be written to correctly. Once the memory cell 34 has been written to, the end of write line 46 is pulsed high to force the gate of the particular load transistor 42 or 44 to a "0" (since the bitline 32a or 32b is also low). When the load transistor 42 or 44 is turned on, the bitline 32a or 32b is pulled high which holds the NOR output 60 or 62 low. As a result, when the end of write line 46 returns to a low level, the load transistors 42 and 44 are active and ready for the next read or write cycle.

If a particular bitline 32a or 32b is shorted to the supply voltage VCC, the corresponding NOR gate 48 or 50 will detect this level independently of the read or write operation. As a result, the corresponding load transistor 42 or 44 will be shut off, eliminating the current from the supply voltage VCC through the load device 42 or 44 to VSS. This is desirable since the bitline 32a or 32b would generally be disconnected in such a situation. If the load transistors 42 and 44 are not disconnected from the disabled bitlines 32a and 32b, current will be burned continuously. Certain specifications require that a minimum amount of current be burned. If the bitline load transistors 42 and 44 are not disconnected during a short to VSS, current use may be in the milliamp range, which may be above certain particular low current specifications.

After a write, there may be a momentary pulse on the EOW line 46. During the pulse, the bitlines 32a and 32b are generally both brought back to a high level. As a result, during a read operation the bitlines 32a and 32b generally swing only a couple hundred millivolts from VCC (or some reference level from VCC). During a write, either the bitline 32a or 32b is generally low to write into the memory cell 34. The bitlines 32a or 32b generally need to have sufficient voltage levels to over power the memory cell 34. When the control block 38 pulses, the load transistors 42 and 44 are turned back on. This causes the output 60 or 62 of the control block 38 to go low, which generally forces the load transistors 42 and 44 back on. As a result, the bitlines 32a and 32b generally recover.

The load devices 42 and 44 are generally turned ON. Under this condition, if the bitlines 32a and 32b are shorted, the circuit 30 cannot meet the low current specification. The circuit 30 turns off the load transistors 42 and 44 so that a limited current is burned which may result in a low current specification being met.

The circuit 30 operates in normal operation during a write and then pulls one of the bitlines 32a or 32b low. After a write, the pulse gets generated by the EOW line 46 which generally turns the load transistors 42 and 44 back on.

Figure 5:
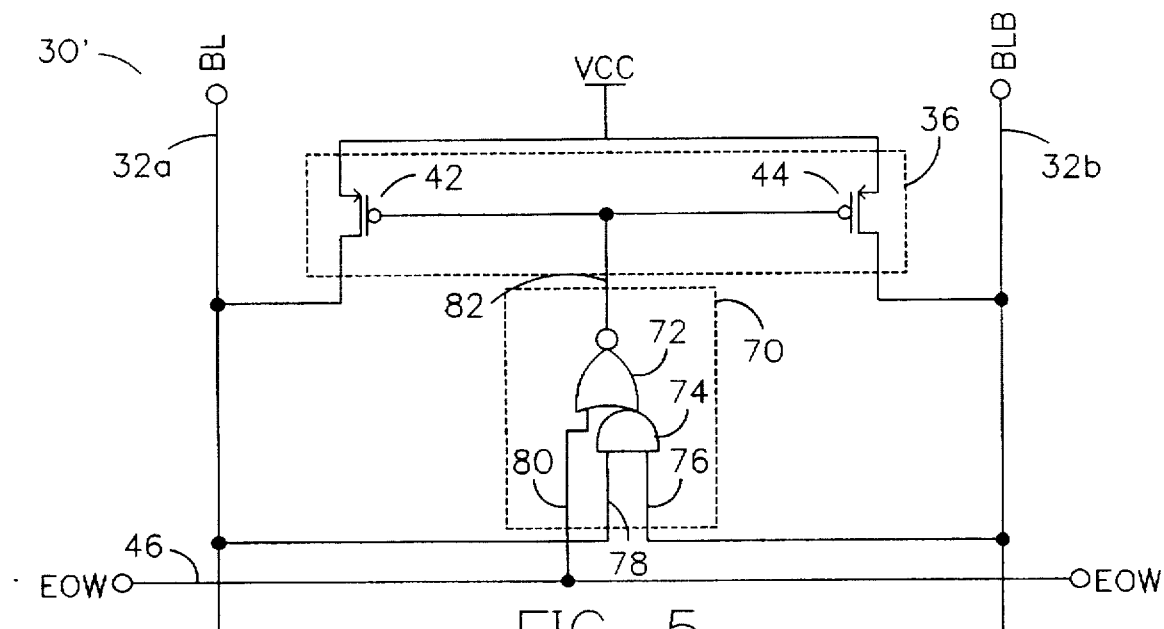
FIG. 5 is an alternate embodiment of the present invention.

Referring to FIG. 5, an alternate implementation circuit 30' is shown. The control block 38 is shown to be comprised of a complex logic gate 70. The complex logic gate 70 generally comprises a NOR gate 72 and an AND gate 74. The AND gate 74 has an input 76 that generally receives a signal from the bitline 32b and a second input 78 that generally receives a signal from the bitline 32a. The output of the AND gate 74 is generally presented to an input of the NOR gate 72. The second input 80 of NOR gate 72 generally receives a signal from the end of write line 46. The logic gate 70 generally presents a signal at an output 82. Generally, the circuit 30' replaces the block 38 with the block 70.

Figure 6:
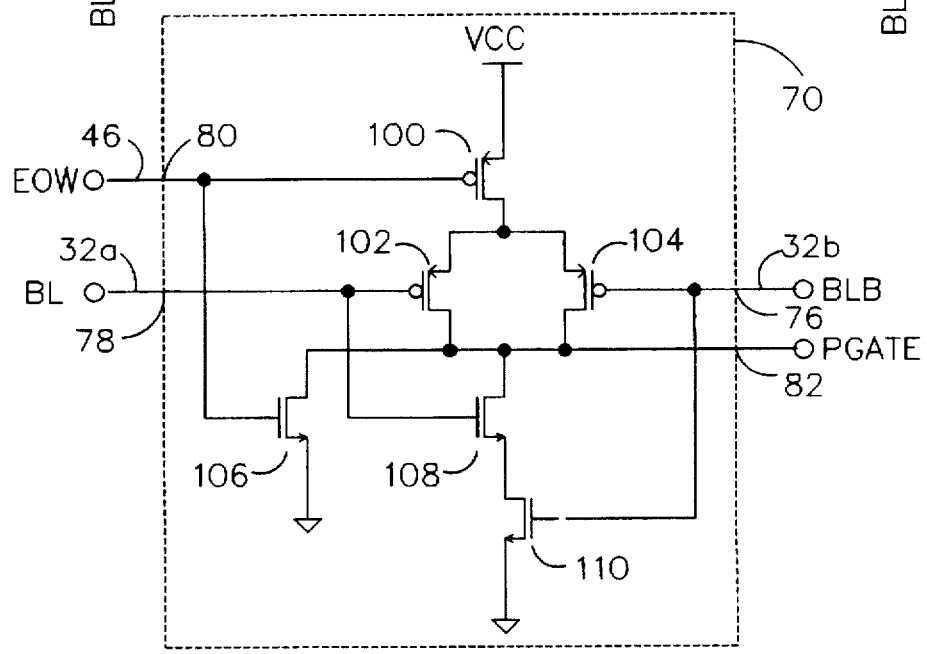
FIG. 6 is a circuit of a logic gate of the alternate embodiment.

Referring to FIG. 6, a more detailed diagram of the logic gate 70 is shown. The logic gate 70 generally comprises a transistor 100, a transistor 102, a transistor 104, a transistor 106, a transistor 108 and a transistor 110. The transistors 100, 102 and 104 are shown generally implemented as PMOS transistors. The transistors 106, 108 and 110 are shown generally implemented as NMOS transistors. The transistors 100-110 may be designed in an alternate implementation to produce the logic shown in FIG. 5. The input 76 may receive a signal from the bitline 32b, the input 78 may receive an input from the bitline 32a, the input 80 may receive a signal from the EOW line 46 and the output 82 may present a signal PGATE that represents the output of the logic gate 70.

The invention eliminates fuses and also improves the write margins as well. Generally, a fuse will still be required to disconnect a defective column in general. The present invention is used to shut off the load (which eliminates the current) without adding an additional fuse.

While the invention has been particularly shown and described with reference to the preferred embodiments thereof, it will be understood by those skilled in the art that various changes in form and details may be made without departing from the spirit and scope of the invention.

We claim:

1. A circuit comprising:

a memory cell having (i) first and second bitlines, (ii) first and second bitline loads connected to said first and second bitlines, and (iii) a write control signal; and a bitline control circuit configured to disconnect said bitline loads from said bitlines during a cell disabling condition, wherein said bitline control circuit is directly connected to (i) said bitlines, and connected to (ii) said bitline loads, and (iii) said write control signal.

2. The circuit according to claim 1 wherein said write control signal comprises an end of write (EOW) signal.

3. The circuit according to claim 1 wherein said cell disabling condition occurs during a short between the bitlines and ground.

4. A circuit comprising:

a memory cell having (i) first and second bitlines, (ii) first and second bitline loads connected to said first and second bitlines, and (iii) a write control signal; and a bitline control circuit configured to disconnect said bitline loads from said bitlines during a cell disabling condition, wherein said bitline control circuit comprises one or more logic gates each having a first input connected to said write control signal and a second input connected to (i) one of said bitlines and (ii) one of said bitline loads.

5. The circuit according to claim 4 wherein said logic gate comprises a NOR gate.

6. The circuit according to claim 4 wherein said bitline loads each comprise a transistor.

7. The circuit according to claim 6 wherein each transistor comprises a P-channel transistor.

8. The circuit according to claim 5 wherein said bitline control circuit comprises (i) an AND gate coupled to said bitlines and (ii) a NOR gate coupled to said AND gate and said write control signal.

9. The circuit according to claim 8 wherein said NOR gate presents a signal that disconnects said bitline loads from said bitlines.

10. A circuit comprising:

memory means having (i) first and second bitlines, (ii) first and second bitline loads connected to said first and second bitlines, and (iii) a write control signal; and means for disconnecting said bitline loads from said bitlines during a cell disabling condition, wherein said disconnecting means is directly connected to (i) said bitlines, and connected to (ii) said bitline loads, and (iii) said write control signal.

11. The circuit according to claim 10 wherein said write control signal comprises an end of write (EOW) signal.

12. The circuit according to claim 10 wherein said cell disabling condition occurs during a short between the bitlines and ground.

13. A circuit comprising:

memory means having (i) first and second bitlines, (ii) first and second bitline loads connected to said first and second bitlines and (iii) a write control signal; and means for disconnecting said bitline loads from said bitlines during a cell disabling condition, wherein said disconnecting means comprises one or more logic gates each having a first input connected to said write control signal and a second input coupled to (i) one of said bitlines and (ii) one of said bitline loads.

14. The circuit according to claim 13 wherein said logic gate comprises a NOR gate.

15. The circuit according to claim 13 wherein said bitline loads each comprise a transistor.

16. A method for disconnecting bitlines loads from bitlines in a memory array comprising the steps of:

receiving a write control signal; and disabling said bitline loads in response to a state of said bitlines corresponding to a disabling condition, wherein said step of disabling said bitline loads occurs in response to one or more logic gates each having a first input connected to said write control signal and a second input connected to (i) one of said bitlines and (ii) one of said bitline loads.

17. The method according to claim 16 wherein said disabling condition occurs during a short between the bitlines and ground.

* * * * *